United States Patent
Chow et al.

(10) Patent No.: US 7,982,290 B2
(45) Date of Patent: Jul. 19, 2011

(54) CONTACT SPRING APPLICATION TO SEMICONDUCTOR DEVICES

(75) Inventors: Eugene M. Chow, Fremont, CA (US); Christopher L. Chua, San Jose, CA (US); Eric Peeters, Fremont, CA (US)

(73) Assignee: Palo Alto Research Center, Inc., Palo Alto, CA (US)

( * ) Notice: Subject to any disclaimer, the term of this patent is extended or adjusted under 35 U.S.C. 154(b) by 364 days.

(21) Appl. No.: 11/331,656

(22) Filed: Jan. 12, 2006

(65) Prior Publication Data

US 2007/0158816 A1    Jul. 12, 2007

(51) Int. Cl.
H01L 23/495 (2006.01)
H01L 29/40 (2006.01)
H01L 23/48 (2006.01)

(52) U.S. Cl. .......... 257/668; 257/697; 257/778
(58) Field of Classification Search .......... 257/668, 257/697, 778
See application file for complete search history.

(56) References Cited

U.S. PATENT DOCUMENTS

| | | | | |
|---|---|---|---|---|
| 3,632,074 | A * | 1/1972 | Wanesky | 248/346.01 |
| 5,829,128 | A * | 11/1998 | Eldridge et al. | 29/855 |
| 5,944,537 | A * | 8/1999 | Smith et al. | 439/81 |
| 5,989,936 | A * | 11/1999 | Smith et al. | 438/106 |
| 6,499,216 | B1 * | 12/2002 | Fjelstad | 29/842 |
| 6,825,552 | B2 * | 11/2004 | Light et al. | 257/687 |
| 6,827,584 | B2 * | 12/2004 | Mathieu et al. | 439/66 |
| 6,828,668 | B2 * | 12/2004 | Smith et al. | 257/696 |
| 6,835,898 | B2 * | 12/2004 | Eldridge et al. | 174/267 |
| 6,885,106 | B1 * | 4/2005 | Damberg et al. | 257/777 |
| 6,891,255 | B2 * | 5/2005 | Smith et al. | 257/674 |
| 6,946,725 | B2 * | 9/2005 | Hacke | 257/692 |
| 7,048,548 | B2 * | 5/2006 | Mathieu et al. | 439/66 |
| 7,137,830 | B2 * | 11/2006 | Lahiri et al. | 439/81 |
| 7,356,920 | B2 * | 4/2008 | Hantschel et al. | 29/841 |
| 2001/0010946 | A1 * | 8/2001 | Morris et al. | 438/117 |
| 2001/0053620 | A1 * | 12/2001 | Chua et al. | 439/149 |
| 2002/0089067 | A1 * | 7/2002 | Crane et al. | 257/778 |
| 2003/0096519 | A1 * | 5/2003 | Fork et al. | 439/81 |
| 2003/0173107 | A1 * | 9/2003 | Smith et al. | 174/256 |
| 2004/0241909 | A1 * | 12/2004 | Variyam | 438/117 |
| 2005/0040540 | A1 * | 2/2005 | Haba et al. | 257/778 |
| 2005/0042851 | A1 * | 2/2005 | Wen | 438/611 |
| 2005/0167816 | A1 * | 8/2005 | Khandros et al. | 257/692 |
| 2005/0270135 | A1 * | 12/2005 | Chua et al. | 336/192 |
| 2005/0279530 | A1 * | 12/2005 | Kirby et al. | 174/267 |
| 2006/0076693 | A1 * | 4/2006 | Hantschel et al. | 257/784 |
| 2006/0091527 | A1 * | 5/2006 | Tsai et al. | 257/706 |

* cited by examiner

*Primary Examiner* — Matthew C Landau
*Assistant Examiner* — James M Mitchell
(74) *Attorney, Agent, or Firm* — Marger Johnson & McCollom, P.C.

(57) ABSTRACT

A contact spring applicator is provided which includes an applicator substrate, a removable encapsulating layer and a plurality of contact springs embedded in the removable encapsulating layer. The contact springs are positioned such that a bond pad on each contact spring is adjacent to an upper surface of the removable encapsulating layer. The contact spring applicator may also include an applicator substrate, a release layer, a plurality of unreleased contact springs on the release layer and a bond pad at an anchor end of each contact spring. The contact spring applicators apply contact springs to an integrated circuit chip, die or package or to a probe card by aligning the bond pads with bond pad landings on the receiving device. The bond pads are adhered to the bond pad landings. The encapsulating or release layer is then removed to separate the contact springs from the contact spring applicator substrate.

5 Claims, 4 Drawing Sheets

US 7,982,290 B2

CONTACT SPRING APPLICATION TO SEMICONDUCTOR DEVICES

TECHNICAL FIELD

The present disclosure relates to semiconductor devices, solid state devices, sensors and actuators that utilize spring contacts and more particularly to the application of the spring contacts to these devices.

BACKGROUND

Metal spring contacts may be used for electrically connecting integrated circuit chips or dies to circuit boards or other devices and may also be used as probe needles on a probe card. Spring contacts allow for reduced pitch, and thus, smaller devices. Spring contacts and methods of forming them are known in the art.

Spring contacts may be formed by depositing a release layer on a substrate or some other underlying layer. In this approach, layers of engineered spring metal are deposited onto the release layer and conductive bond pads and patterned. The release layer is then etched away to release a free end of the spring which curls up and away from the substrate. Another approach involves overplating or cladding the released spring contact.

The method described above requires the spring contact to be formed on the wafer as part of the wafer manufacturing process, which requires the sputtering of metals not normally used in the manufacturing process.

Anisotropic Conductive Film (ACF) tape separates the application of conductive contacts from the chip manufacturing process. ACF tape has limitation as to how small a pitch can be used by the chip. Smaller pitch sizes may lead to short circuiting within the tape between adjacent landings. Also, ACF tape is not compliant and is not easy to rework.

SUMMARY OF THE DISCLOSURE

A contact spring applicator has a substrate, a removable encapsulating layer and a plurality of released spring contacts embedded in the encapsulating layer. Each contact spring is positioned to locate a bond pad on an anchor end of the contact spring adjacent to an upper surface of the encapsulating layer. A free end of each contact spring is located near the substrate.

The contact spring applicator may be made by forming a handle substrate and sequentially depositing a handle release layer, a bond pad metallization layer, a spring release layer and a spring metal layer on the handle substrate. The spring metal layer is patterned to form unreleased contact springs. Then the bond pad metallization layer and spring release layer are patterned to form a bond pad and to release the spring contacts. A wax encapsulating layer may be formed on a contact spring applicator substrate. The contact springs and bond pads on the handle substrate are embedded in the wax encapsulating layer such that the bond pads are adjacent to an upper surface of the wax encapsulating layer. The handle release layer is then removed to remove the handle release layer and the handle substrate from the contact springs and bond pads.

A contact spring applicator may also have an applicator substrate, a release layer, a plurality of patterned unreleased contact springs and a bond pad on an anchor end of each contact spring.

DETAILED DESCRIPTION

It is often desirable to make springs on input/output ports of integrated circuits (IC) in order to use the spring to electrically connect to other devices. However, the spring manufacturing process can be incompatible with the IC manufacturing process. Therefore, it would be helpful to decouple the spring fabrication process from the IC manufacturing process and then bond the springs to the ICs after IC manufacture. Also, it would be helpful to have a spring manufacturing process that is independent of the IC manufacturing process because spring can then be placed on a large variety of ICs from different IC manufacturers.

This disclosure describes means of separating the IC manufacturing process from the spring manufacturing process through the use of a contact spring applicator. The contact spring applicator allows for the formation of the spring contacts to be separated from the manufacturing of an integrated circuit or die. A plurality of contact springs are contained on the applicator. After the chip, die or package is separately manufactured, bond pads on the contact springs are fused to select contact pads on the chip, die or package, and the applicator material is removed leaving the contact springs on the chip, die or package.

Figure 1:
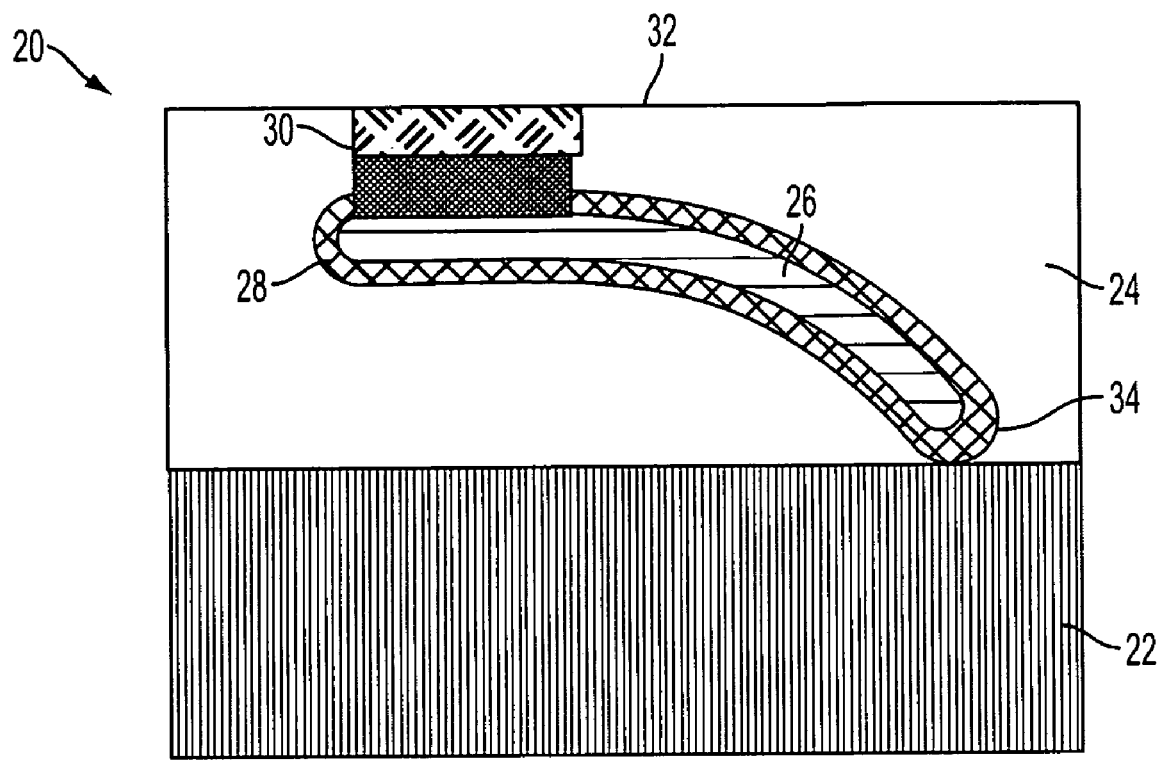
FIG. 1 is a cross-sectional view of an example of a contact spring applicator as described herein.

FIG. 1 is a cross-sectional view of a portion of a contact spring applicator 20. The applicator 20 includes a substrate 22 an encapsulating layer 24 and a plurality of contact springs 26 embedded in the encapsulating layer. Each contact spring 26 is positioned to have an anchor end 28 and a bond pad 30 attached to the anchor end with the bond pad adjacent to an upper surface 32 of the encapsulating layer 24. The free end 34 of the contact spring 26 is positioned near the substrate.

The substrate 22 may be made from a flexible sheet and/or tape or may be made from a rigid material, including but not limited to silicon substrate or a circuit board. The encapsulating layer 24 may be a sacrificial layer which can later be removed without damaging the pads, springs and substrate. For example, a meltable material may be used as the encapsulating layer 24 and may be melted to release the substrate 22 from the contact springs 26 after the contact springs have been applied. An example of such a meltable material is wax.

Figure 2:
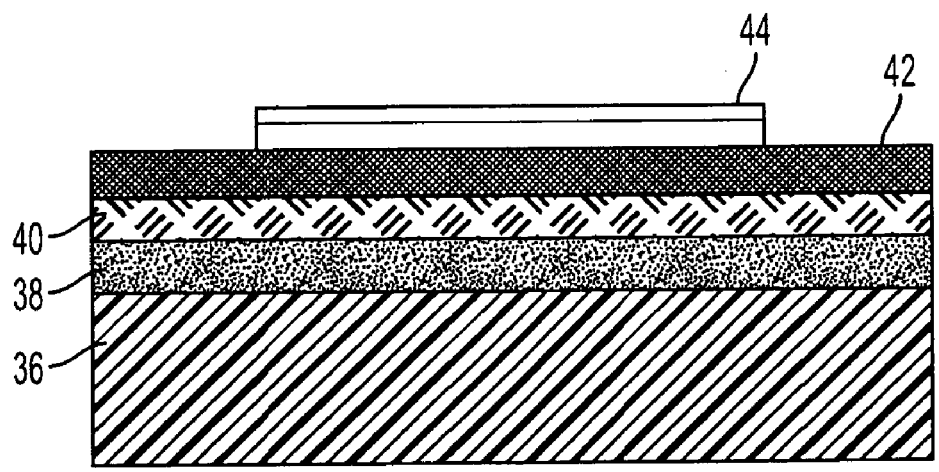
FIGS. 2-4 are cross-sectional views showing an example of a method of manufacturing a contact spring applicator.
Figure 3:
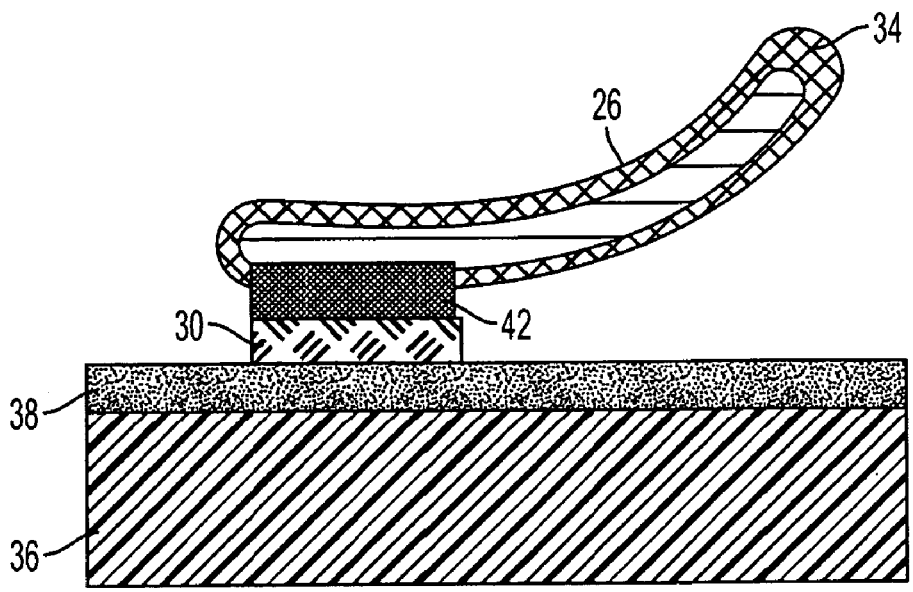
Figure 4:
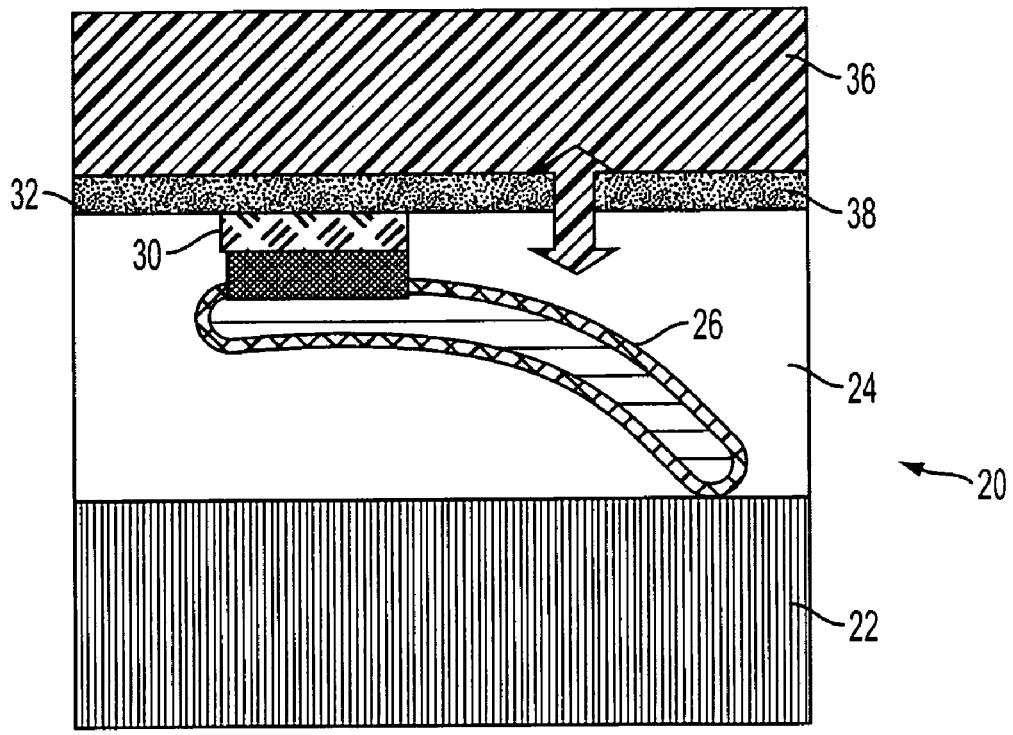

FIGS. 2-4 are cross-sectional views showing a method of manufacturing the contact spring applicator 20. A handle substrate 36 is deposited. A handle release layer 38 is deposited on the handle substrate 36. A bond pad metallization layer 40 is deposited on the handle release layer 38. A spring release layer 42 is deposited on the bond pad metallization layer 40. A spring metal layer 44 is deposited on the spring release layer 42.

The spring metal layer 44 is patterned to create spring contacts 26. The spring release layer and the bond pad metallization layer are patterned to create bond pad 30 and release the free end 34 of the contact spring 26. The contact spring 26 may then be overplated, if desired.

A removable encapsulating layer 24 is deposited on the applicator substrate 22. In one embodiment, the removable encapsulating layer is a wax that can be melted at around 110°

C., but crystallizes into a solid mass at room temperature. The wax may also be dissolved in solvents such as acetone. The plurality of contact springs 26 on handle substrate 36 are then embedded in the removable encapsulating layer 24 with the bond pad 30 adjacent to an upper surface 32 of the removable encapsulating layer 24.

The handle release layer 38 and handle substrate 36 are then removed from the spring release layer 42 leaving the plurality of contact springs 26 embedded on the contact spring applicator 20, resulting in the structure shown in FIG. 1.

The handle release layer 38 may be a crystalbond wax layer. A solvent such as acetone may then be used to dissolve the handle release layer 38 to remove the handle release layer and the handle substrate 36.

The handle release layer 38 may also be a thermal release material or tape. The thermal release material is the heat-activated to remove the handle release layer 38 and the handle substrate 36.

The handle release layer may also be an ultraviolet (UV) release material. The UV release material is then activated by applying ultraviolet light to remove the handle release layer 38 and the handle substrate 36.

Figure 5:
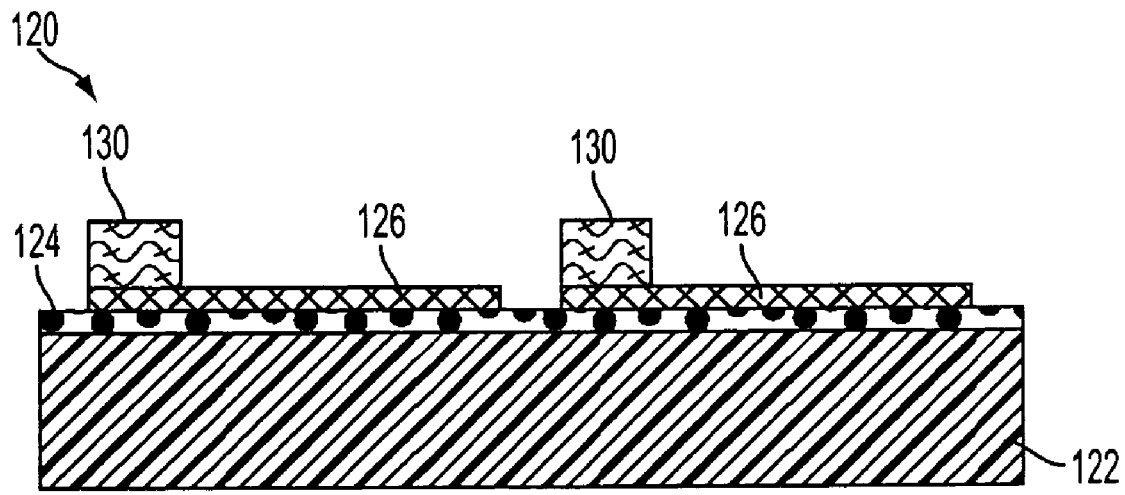
FIG. 5 is a cross-sectional view of another example of a contact spring applicator including unreleased springs on an applicator substrate.

FIG. 5 is a cross-sectional view of another contact spring application 120. The applicator 120 includes a substrate 122, a release layer 124 and a plurality of patterned spring metal 126 formed on the release layer. This spring metal is designed with a stress gradient so that later, when the substrate 122, onto which the spring is deposited, is removed, the spring tip will release and move down toward where the substrate was. This is in contrast to the stress gradient shown in FIG. 3, which directs the spring tip to move up away from the substrate 122 when released. Bond pads 130 are formed on each patterned spring metal 126.

The substrate 122 may be made from a flexible sheet and/or tape or may be made from a rigid material, including but not limited to a silicon substrate or a circuit board. The substrate 122 has a plurality of contact springs 126 spaced to be fused to a plurality of bond pad landings on an integrated circuit, chip, die or package. The contact springs 126 may also be utilized as probe needles on a probe card.

The release layer 124 may be made from a crystalbond wax, a thermal release material or tape, an ultraviolet (UV) release tape or silicon. When the release layer 124 is made from silicon, the substrate 122 and release layer 124 may be removed from the patterned spring metal 126 by etching the silicon with xenon diflouride or some other appropriate etchant.

Figure 6:
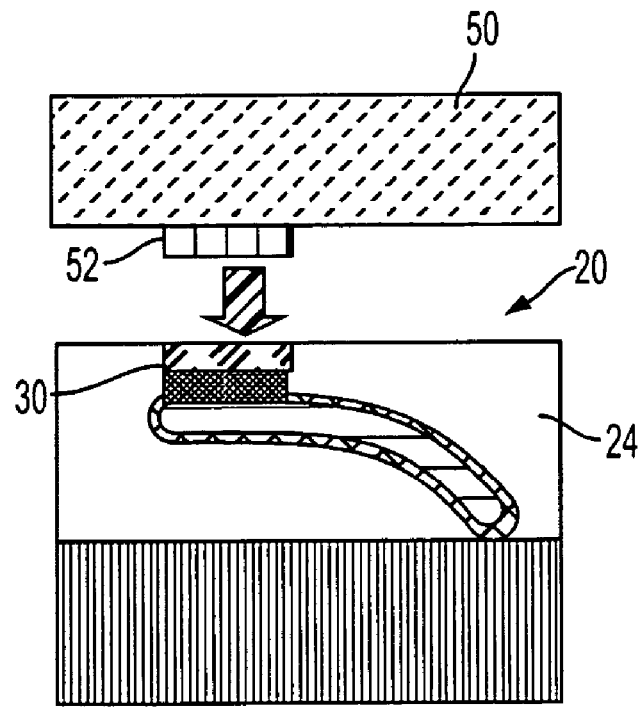
FIGS. 6-7 are cross-sectional views showing an example of a method of applying spring contacts.
Figure 7:
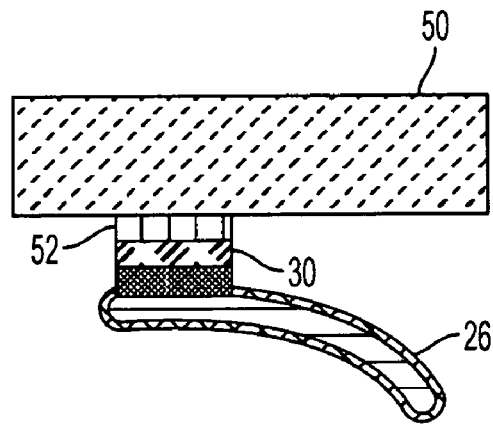

FIGS. 6-9 are cross-sectional views showing methods of applying spring contacts using the spring contact applicators 20 and 120. Referring to FIGS. 6-7 showing spring contact applicator 20, each bond pad 30 is aligned with chip pads 52 on the device 50 receiving the contact springs 26. Examples of device 50 include but are not limited to an integrated circuit, an optoelectronic device, a sensor, an actuator, a meme device, all of which are on substrates such as silicon, printed circuit board, plastic, glass or polymer. The plurality of bond pads 30 are adhered to the plurality of bond pad landings 52. The device 50, pad 52, pad 30 and spring 26 are then separated from the substrate 22 by removing the removable encapsulating layer 24. Any residue of the encapsulating layer 24 may then be cleaned off of the contact spring 26 and device 50.

Figure 8:
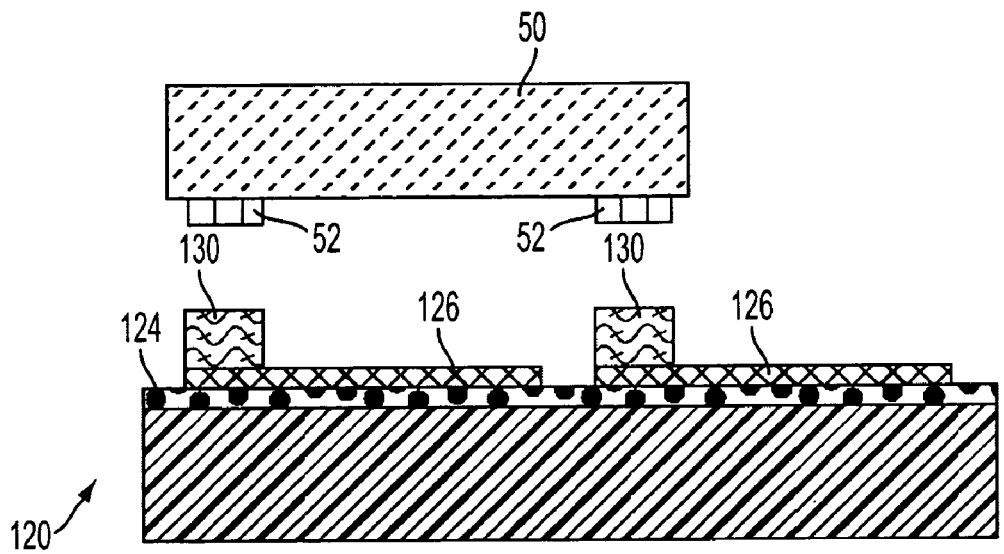
FIGS. 8-9 are cross-sectional view showing another example of a method of applying spring contacts.
Figure 9:
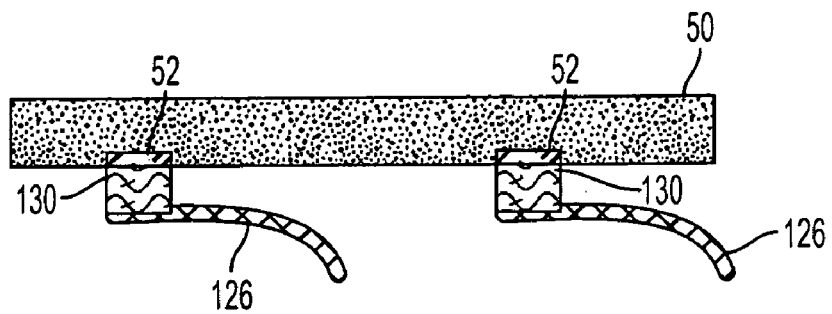

Referring to FIGS. 8-9 showing spring applicator 120, the plurality of bond pads 130 are aligned with a plurality of bond pad landings 52 on device 50. The release layer 124 is then removed to separate the contact springs 126 from the substrate 122 and to release the contact springs 126. Note that the spring tips on spring applicator 120 rise out of the plane, toward where the substrate 122 was and away from the device 50.

The release layer 124 may be a crystalbond was layer. A solvent such as acetone may then be used to dissolve the crystalbond wax layer 124 to separate and release the contact springs 126.

The release layer 124 may also be a thermal release material or tape. The thermal release material 124 is then activated by applying heat to separate and release the contact springs 126.

The release layer 124 may also be an ultraviolet (UV) release material. The UV release material 124 is then activated by applying ultraviolet light to separate and release the contact springs 126.

The release layer may also be a sacrificial layer such as titanium, oxide and silicon which may be removed by etching or some other process.

It will be appreciated that various of the above-disclosed and other features and functions, or alternatives thereof, may be desirably combined into many other different systems or applications. Various presently unforeseen or unanticipated alternatives, modifications, variations, or improvements therein may be subsequently made by those skilled in the art which are also intended to be encompassed by the following claims.

The invention claimed is:

1. A semiconductor package spring contact applicator comprising:
    a substrate;
    a removable encapsulating layer formed on the substrate;
    a plurality of spring contacts arrayed in the removable encapsulating layer, wherein each spring contact is positioned to have an anchor end with a bond pad adjacent to an upper surface of the removable encapsulating layer and a free end near the substrate, the removable encapsulating layer being removable separate from the spring contact;
    a handle release layer on the removable encapsulating layer; and
    a handle substrate on the handle release layer, wherein the handle substrate is arranged to be removed with the handle release layer.

2. The spring contact applicator of claim 1, wherein the substrate comprises a flexible sheet and/or tape.

3. The spring contact applicator of claim 1, wherein the substrate comprises a rigid material.

4. The spring contact applicator of claim 1, wherein the removable encapsulating layer comprises a wax.

5. The spring contact applicator of claim 1, wherein each spring contact has cladding.

* * * * *